US012295222B2

(12) United States Patent
Eom

(10) Patent No.: US 12,295,222 B2
(45) Date of Patent: May 6, 2025

(54) DISPLAY DEVICE WITH CONNECTION PATTERN OVERLAPPING DEMUX CIRCUIT IN NON-DISPLAY AREA

(71) Applicant: Samsung Display Co., Ltd., Yongin-Si (KR)

(72) Inventor: Taejong Eom, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 812 days.

(21) Appl. No.: 17/354,793

(22) Filed: Jun. 22, 2021

(65) Prior Publication Data

US 2022/0037450 A1 Feb. 3, 2022

(30) Foreign Application Priority Data

Jul. 31, 2020 (KR) .................. 10-2020-0096027

(51) Int. Cl.
*H10K 59/131* (2023.01)
*G09G 3/3291* (2016.01)
*H10K 59/122* (2023.01)
*H10K 59/124* (2023.01)

(52) U.S. Cl.
CPC ......... *H10K 59/131* (2023.02); *G09G 3/3291* (2013.01); *H10K 59/122* (2023.02); *H10K 59/124* (2023.02); *G09G 2300/0426* (2013.01); *G09G 2310/0297* (2013.01)

(58) Field of Classification Search
CPC .. H10K 59/131; H10K 59/122; H10K 59/124; G09G 3/3291; G09G 2300/0426; G09G 2310/0297
See application file for complete search history.

(56) References Cited

U.S. PATENT DOCUMENTS

2018/0046301 A1* 2/2018 Zhou ................. G06F 3/0445
2019/0181211 A1* 6/2019 Bae ................. G09G 3/3225
2020/0357345 A1* 11/2020 Cho ................. G09G 3/3233

FOREIGN PATENT DOCUMENTS

| JP | 4049330 B2 | 2/2008 |
| KR | 10-0501427 B1 | 7/2005 |
| KR | 10-2016-0055333 A | 5/2016 |
| KR | 10-2019-0071029 A | 6/2019 |

* cited by examiner

*Primary Examiner* — Lex H Malsawma
(74) *Attorney, Agent, or Firm* — Innovation Counsel LLP

(57) ABSTRACT

A display device comprises a pixel part including a plurality of pixels and disposed in a display area, a demultiplexing circuit part disposed in a non-display area surrounding the display area and transferring a data voltage to the pixel part, and a connection pattern disposed in the non-display area, transferring a constant voltage to the pixel part, and including a first portion overlapping the demultiplexing circuit part and a second portion disposed between the first portion and the pixel part. A plurality of first penetration holes vertically penetrating the first portion are formed in the first portion, and a plurality of second penetration holes vertically penetrating the second portion are formed in the second portion.

18 Claims, 10 Drawing Sheets

DISPLAY DEVICE WITH CONNECTION PATTERN OVERLAPPING DEMUX CIRCUIT IN NON-DISPLAY AREA

CROSS-REFERENCE TO RELATED APPLICATION

This application claims priority under 35 USC § 119 to Korean Patent Application No. 10-2020-0096027, filed on Jul. 31, 2020, in the Korean Intellectual Property Office (KIPO), the entire disclosure of which is incorporated herein by reference.

BACKGROUND

1. Field

The present disclosure relates generally to a display device. More particularly, the present disclosure relates to a display device capable of preventing pixel shrinkage defect.

2. Description of the Related Art

The display device includes a plurality of metal layers and insulating layers disposed between the metal layers. Pixels disposed in a display area and lines disposed in the non-display area may be formed of the metal layers. The insulating layers include an insulating material to prevent a short between the metal layers. For example, the insulating layers include an inorganic material or an organic material.

Meanwhile, gas generated from the organic material is discharged from the insulating layers including the organic material. For example, gas is discharged to the pixels from insulating layers disposed between the lines in the non-display area. Accordingly, the pixels adjacent to the non-display area may be deteriorated, and a pixel shrinkage defect of the pixels may occur.

The above information disclosed in this Background section is only for understanding of the background of the present disclosure, and, therefore, it may contain information that does not constitute prior art.

SUMMARY

Some example embodiments provide a display device capable of preventing pixel shrinkage defect.

A display device according to an example embodiment may include a pixel part including a plurality of pixels and disposed in a display area, a demultiplexing circuit part disposed in a non-display area surrounding the display area and configured to transfer a data voltage to the pixel part, and a connection pattern disposed in the non-display area, configured to transfer a constant voltage to the pixel part, and including a first portion overlapping the demultiplexing circuit part and a second portion disposed between the first portion and the pixel part. A plurality of first penetration holes vertically penetrating the first portion may be formed in the first portion, and a plurality of second penetration holes vertically penetrating the second portion may be formed in the second portion.

According to an example embodiment, the second portion protruded from the first portion may include the second penetration holes and protruded portions spaced apart from each other.

According to an example embodiment, an area of each of the second penetration holes may be larger than an area of each of the first penetration holes.

According to an example embodiment, the display device may further include a first organic insulating layer disposed under the first portion of the connection pattern and a second organic insulating layer disposed between the connection pattern and the first organic insulating layer. Each of the second penetration holes may expose an upper surface of the second organic insulating layer and a side surface of the second organic insulating layer.

According to an example embodiment, the protruded portions may cover the upper surface of the second organic insulating layer and the side surface of the second organic insulating layer.

According to an example embodiment, the first organic insulating layer may contact the second organic insulating layer.

According to an example embodiment, each of the pixels may include a transistor substrate and an emission structure disposed on the transistor substrate, the transistor substrate may include a base substrate, an active pattern disposed on the base substrate, a first connection electrode disposed on the active pattern and being connected to the active pattern, and a second connection electrode disposed on the first connection electrode and being connected to the first connection electrode, and the emission structure may include a first electrode, a pixel defining layer in which an opening exposing an upper surface of the first electrode is formed, an emission layer disposed on the first electrode, and a second electrode disposed on the emission layer. The connection pattern may be disposed in a same layer as the first electrode.

According to an example embodiment, the transistor substrate may further include a first planarization layer disposed on the first connection electrode, including an organic material, and covering the first connection electrode and a second planarization layer disposed on the first planarization layer, including an organic material, and covering the second connection electrode. The first organic insulating layer may be disposed in a same layer as the first planarization layer, and the second organic insulating layer may be disposed in a same layer as the second planarization layer.

According to an example embodiment, the display device may further include a connection line disposed under the protruded portions and overlapping the protruded portions, and the connection line may include a first connection line disposed in a same layer as the first connection electrode and a second connection line disposed on the first connection line and contacting the first connection line.

According to an example embodiment, the second portion may have a rectangular shape, and an area of each of the second penetration holes may be equal to an area of each of the first penetration holes According to an example embodiment, the display device may further include a first organic insulating layer disposed under the connection pattern and a second organic insulating layer disposed between the connection pattern and the first organic insulating layer. Each of the second penetration holes may expose an upper surface of the second organic insulating layer and a side surface of the second organic insulating layer.

According to an example embodiment, the first organic insulating layer may contact the second organic insulating layer.

According to an example embodiment, the second portion may have a rectangular shape, and an area of each of the second penetration holes may be larger than an area of each of the first penetration holes.

According to an example embodiment, the display device may further include a first organic insulating layer disposed under the first portion of the connection pattern and a second organic insulating layer disposed between the connection pattern and the first organic insulating layer. Each of the second penetration holes may expose an upper surface of the second organic insulating layer and a side surface of the second organic insulating layer.

According to an example embodiment, the first portion may have a rectangular shape.

According to an example embodiment, the constant voltage may be an initialization voltage.

According to an example embodiment, the constant voltage may be a high power voltage.

According to an example embodiment, the constant voltage may be a low power voltage.

Therefore, a display device according to example embodiments may include a pixel part and a connection pattern that transmits a constant voltage to the pixel part. A plurality of penetration holes vertically penetrating the connection pattern may be formed in the connection pattern. For example, the penetration holes may be formed in the connection pattern adjacent to the pixel part. The penetration holes may expose an upper surface and a side surface of the organic insulating layer disposed under the connection pattern. Accordingly, the gas discharged from the organic insulating layer may be discharged in a direction perpendicular to the organic insulating layer. In other words, the gas discharged from the organic insulating layer may not be discharged to the pixel part. Accordingly, pixels adjacent to the connection pattern may not be deteriorated, and a pixel shrinkage defect of the pixels may be prevented.

It is to be understood that both the foregoing general description and the following detailed description are example and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate example embodiments of the present disclosure, and together with the description serve to explain the present disclosure.

DETAILED DESCRIPTION

Illustrative, non-limiting example embodiments will be more clearly understood from the following detailed description in conjunction with the accompanying drawings.

Figure 1:
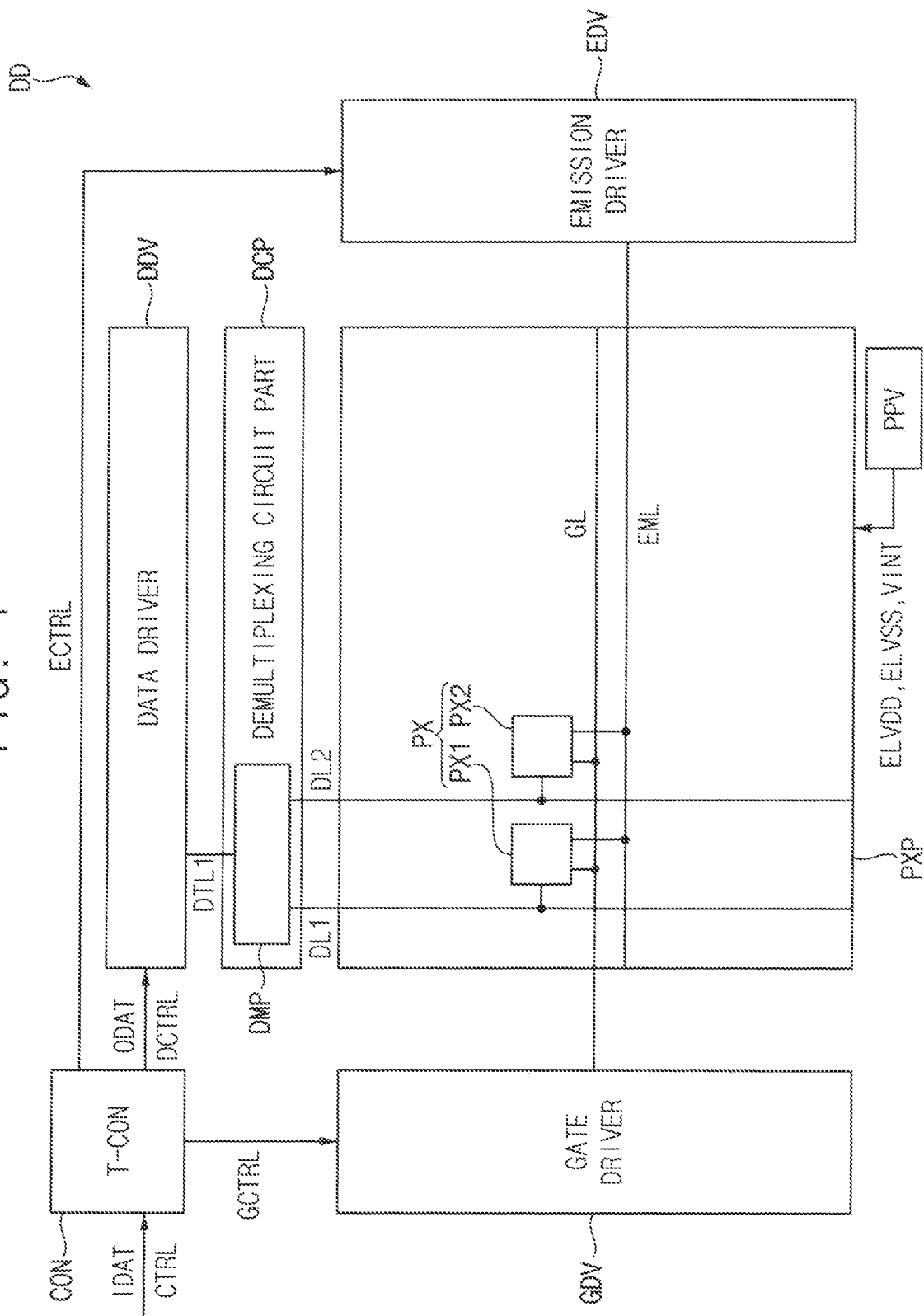
FIG. 1 is a block diagram illustrating a display device according to an example embodiment.

FIG. 1 is a block diagram illustrating a display device according to an example embodiment.

Referring to FIG. 1, a display device DD according to an example embodiment may include a pixel part PXP, a data driver DDV, a demultiplexing circuit part DCP, a gate driver GDV, an emission driver EDV, a controller CON, and a power provider PPV.

The pixel part PXP may include a plurality of pixels PX. The pixels PX may be arranged along a first direction D1, and may be arranged along a second direction D2 crossing the first direction D1. For example, the pixel part PXP may include a first pixel PX1 and a second pixel PX2 arranged side by side along the first direction D1.

In addition, a plurality of gate lines, a plurality of emission control lines, a plurality of data lines, a plurality of high power voltage lines, and a plurality of initialization voltage lines may be disposed in the pixel part PXP. For example, a gate line GL extending in the first direction D1, a emission control line EML extending in the first direction D1, and the data lines DL1 and DL2 extending in the second direction D2 may be disposed in the pixel part PXP. For example, the gate line GL may be electrically connected to the first and second pixels PX1 and PX2, and the emission control line EML may be electrically connected to the first and second pixels PX1 and PX2. The first data line DL1 may be electrically connected to the first pixel PX1, and the second data line DL2 may be electrically connected to the second pixel PX2.

The data driver DDV may generate a data voltage DATA based on an output image data ODAT and a data control signal DCTRL. In addition, the data driver DDV may output the data voltage DATA to the demultiplexing circuit part DCP through a first data transmission line DTL1. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal. For example, the data driver DDV may be implemented with one or more integrated circuits ("ICs").

The demultiplexing circuit part DCP may transmit the data voltage DATA to the pixel part PXP. For example, the demultiplexing circuit part DCP may time-divide the data voltage DATA and may transmit the data voltage DATA. In an example embodiment, the demultiplexing circuit part DCP may include a plurality of demultiplexers DMP. For example, the demultiplexer DMP may receive first and second data voltages. The demultiplexer DMP may sequentially transfer the first and second data voltages to the first and second data lines DL1 and DL2, respectively.

The gate driver GDV may generate a gate signal GS based on a gate control signal GCTRL. For example, the gate signal GS may include a first gate signal GW, a second gate signal GC, and a third gate signal GB. Each of the first, second, and third gate signals GW, GC, and GB may include a gate-on voltage for turning on a transistor and a gate-off voltage for turning off the transistor. The gate control signal GCTRL may include a vertical start signal, a clock signal, and the like. For example, the gate driver GDV may be integrated in a peripheral portion of the pixel part PXP.

The emission driver EDV may generate an emission driving signal EM based on an emission control signal ECTRL. The emission driving signal EM may include the gate-on voltage and the gate-off voltage. The emission driving signal EM may include a vertical start signal, a clock signal, and the like. For example, the emission driver EDV may be integrated in a peripheral portion of the pixel part PXP.

The controller CON (e.g., timing controller T-CON) may receive an input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

The power provider PPV may provide a constant voltage to the pixel part PXP. For example, the constant voltage may include an initialization voltage VINT, a high power voltage ELVDD, a low power voltage ELVSS, and the like.

Figure 2:
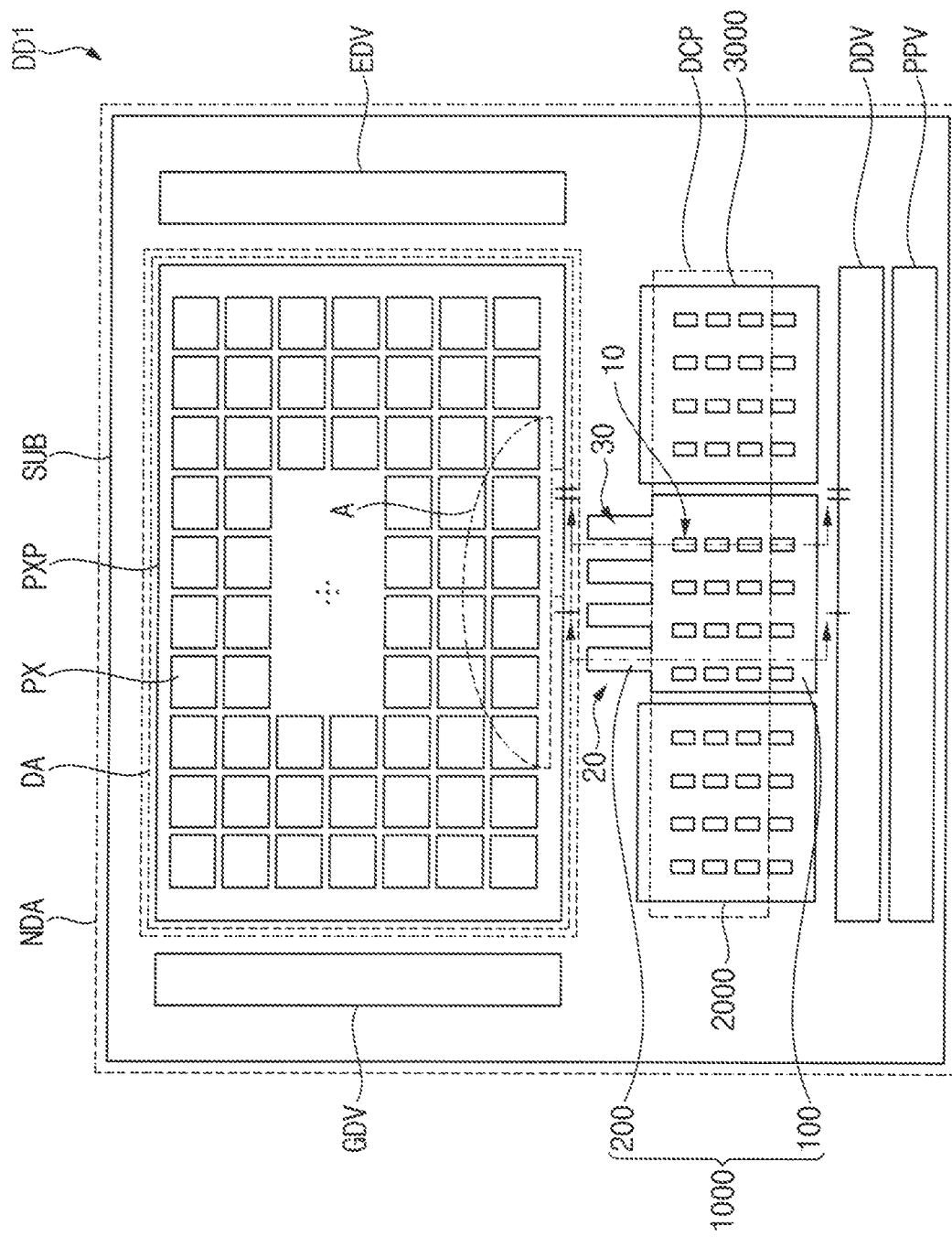
FIG. 2 is a plan view illustrating a display device according to an example embodiment.

FIG. 2 is a plan view illustrating a display device according to an example embodiment.

Referring to FIGS. 1 and 2, a display device DD1 according to an example embodiment may include a display area DA and a non-display area NDA surrounding the display area DA. The pixel part PXP may be disposed in the display area DA. The gate driver GDV, the emission driver EDV, the demultiplexing circuit part DCP, the data driver DDV, the power provider PPV, and connection patterns may be disposed in the non-display area NDA. For example, the connection patterns may include a first connection pattern 1000, a second connection pattern 2000, and a third connection pattern 3000.

In an example embodiment, the pixel part PXP may have a rectangular shape. The gate driver GDV may be adjacent to a first short side of the rectangular shape, and the emission driver EDV may be adjacent to a second short side of the rectangular shape.

In an example embodiment, the data driver DDV may be adjacent to a long side of the rectangular shape. The demultiplexing circuit part DCP may be disposed between the pixel part PXP and the data driver DDV. The demultiplexing circuit part DCP may receive the data voltage DATA from the data driver DDV and may transmit the data voltage DATA to the pixel part PXP.

In an example embodiment, the power provider PPV may be adjacent to the long side of the rectangular shape. For example, the data driver DDV may be disposed between the pixel part PXP and the power provider PPV. The first, second, and third connection patterns 1000, 2000, and 3000 may be disposed between the pixel part PXP and the power provider PPV.

In an example embodiment, the first connection pattern 1000 may be disposed between the second connection pattern 2000 and the third connection pattern 3000. The second connection pattern 2000 may be disposed adjacent to a left side of the first connection pattern 1000, and the third connection pattern 3000 may be disposed adjacent to a right side of the first connection pattern 1000. In addition, the first connection pattern 1000 may be disposed closer to the pixel part PXP than the second and third connection patterns 2000 and 3000. However, an arrangement structure of the first, second, and third connection patterns 1000, 2000, and 3000 is not limited to the above. For example, the second connection pattern 2000 may be disposed closer to the pixel part PXP than the first and third connection patterns 1000 and 3000, or the third connection pattern 3000 may be disposed closer to the pixel part PXP than the first and the second connection patterns 1000 and 2000.

In an example embodiment, each of the first, second, and third connection patterns 1000, 2000, and 3000 may receive the constant voltage from the power provider PPV, and may transmit the constant voltage to the pixel part PXP. For example, the first connection pattern 1000 may receive a first constant voltage from the power provider PPV and may transmit the first constant voltage to the pixel part PXP. The second connection pattern 2000 may receive a second constant voltage from the power provider PPV and may transmit the second constant voltage to the pixel part PXP. The third connection pattern 3000 may receive a third constant voltage from the power provider PPV, and may transmit the third constant voltage to the pixel part PXP. For example, the first constant voltage may be the initialization voltage VINT, the second constant voltage may be the high power voltage ELVDD, and the third constant voltage may be the low power voltage ELVSS. However, the first, second, and third constant voltages are not limited to those described above.

In an example embodiment, the first, second, and third connection patterns 1000, 2000, and 3000 may be disposed on the demultiplexing circuit part DCP. For example, the first, second, and third connection patterns 1000, 2000, and 3000 may overlap the demultiplexing circuit part DCP and may cover the demultiplexing circuit part DCP. For example, the demultiplexing circuit part DCP may be formed of a demux active pattern, a first metal layer disposed on the demux active pattern, and a second metal layer disposed on the first metal layer, and the first, second, and third connection patterns 1000, 2000, and 3000 may be formed of a third metal layer disposed on the second metal layer. The demultiplexing circuit part DCP may be protected by the first to third connection patterns 1000, 2000, and 3000 covering the demultiplexing circuit part DCP. For example, as the first connection pattern 1000 to which the first constant voltage is provided overlaps the demultiplexing circuit part DCP, the first connection pattern 1000 may protect the demultiplexing circuit part DCP from static electricity generated around the demultiplexing circuit part DCP.

In an example embodiment, the first connection pattern 1000 may include a first portion 100 and a second portion 200. The first portion 100 may overlap the demultiplexing circuit part DCP. The second portion 200 may be disposed between the first portion 100 and the pixel part PXP. For example, the second portion 200 may extend from the first portion 100 toward the pixel part PXP.

In an example embodiment, an organic insulating layer including an organic material may be disposed on the demultiplexing circuit part DCP, and the first connection pattern 1000 may be disposed on the organic insulating layer. A plurality of first penetration holes 10 vertically penetrating the first portion 100 along a thickness direction (third direction D3) may be formed in the first portion 100. The first penetration holes 10 may expose an upper surface of the organic insulating layer. In addition, a plurality of second penetration holes 20 vertically penetrating the second portion 200 may be formed in the second portion 200. Accordingly, the second portion 200 may protrude from the first portion 100 along the second direction D2, and each of the second portions 200 may be spaced apart from each other along the first direction D1. An area of each of the second penetration holes 20 may be larger than an area of each of the first penetration holes 10.

In an example embodiment, each of the second penetration holes 20 may expose an upper surface of the organic insulating layer and a side surface of the organic insulating layer. In addition, each of the protruded portions 30 may cover the upper surface of the organic insulating layer and the side surface of the organic insulating layer. The first penetration holes 10, the second penetration holes 20, and the protruded portions 30 will be described with reference to FIGS. 7 and 8.

The display device DD1 may include the first connection pattern 1000 in which the first and second penetration holes 10 and 20 are formed. Outgassing of the organic insulating layer disposed under the first connection pattern 1000 may be smoothly performed through the first and second penetration holes 10 and 20. For example, the display device DD1 may include a second portion 200 in which the second penetration holes 20 are formed. Accordingly, a gas discharged from the organic insulating layer may be discharged in a direction perpendicular to the organic insulating layer. In other words, the gas discharged from the organic insulating layer may not be discharged to the pixel part PXP. Accordingly, the pixels PX adjacent to the second portion 200 (e.g., pixels disposed in the area A shown in FIG. 2) may not be deteriorated, and pixel shrinkage defect may be prevented.

Figure 3:
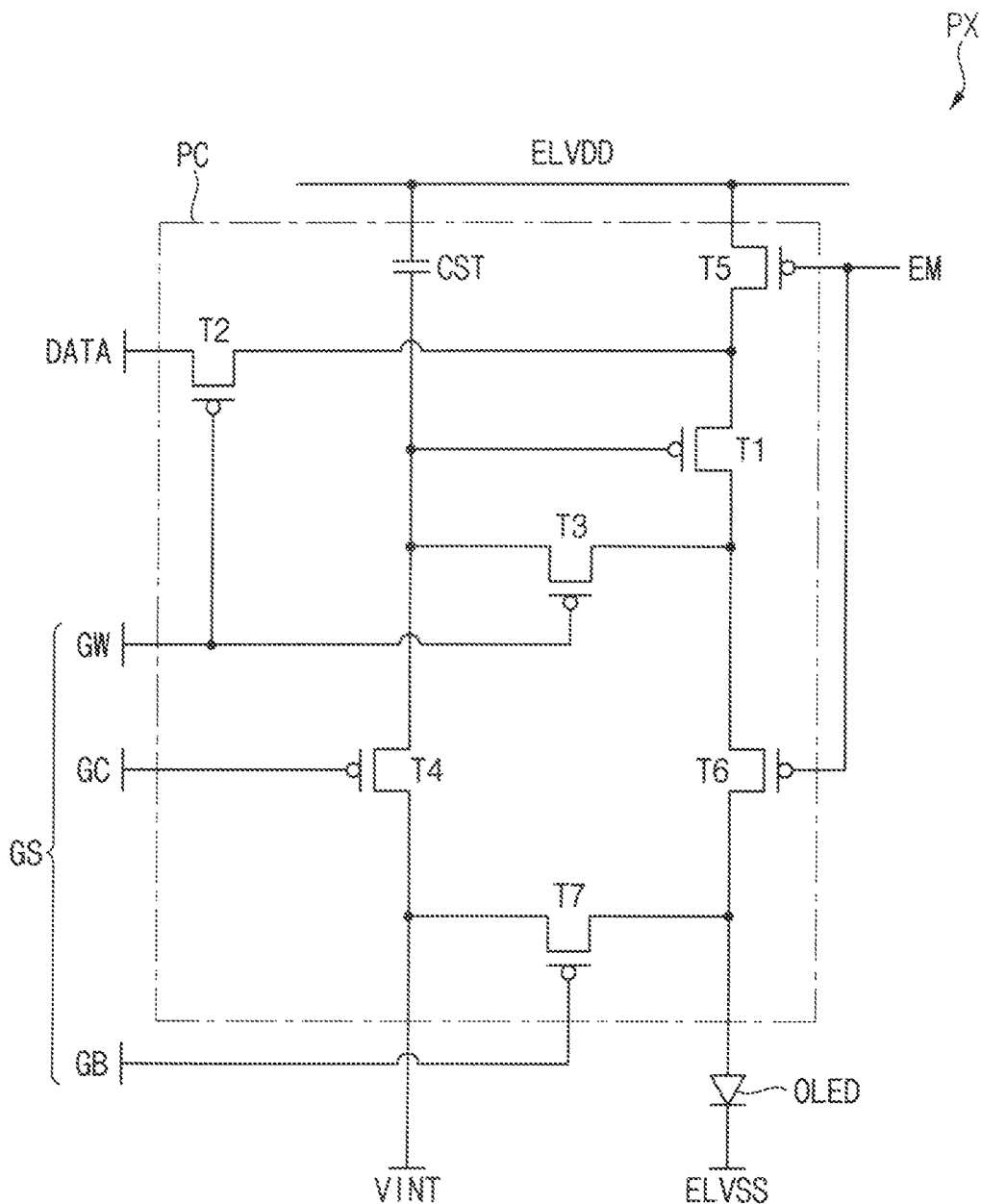
FIG. 3 is a circuit diagram illustrating a pixel included in the display device of FIG. 2.
Figure 4:
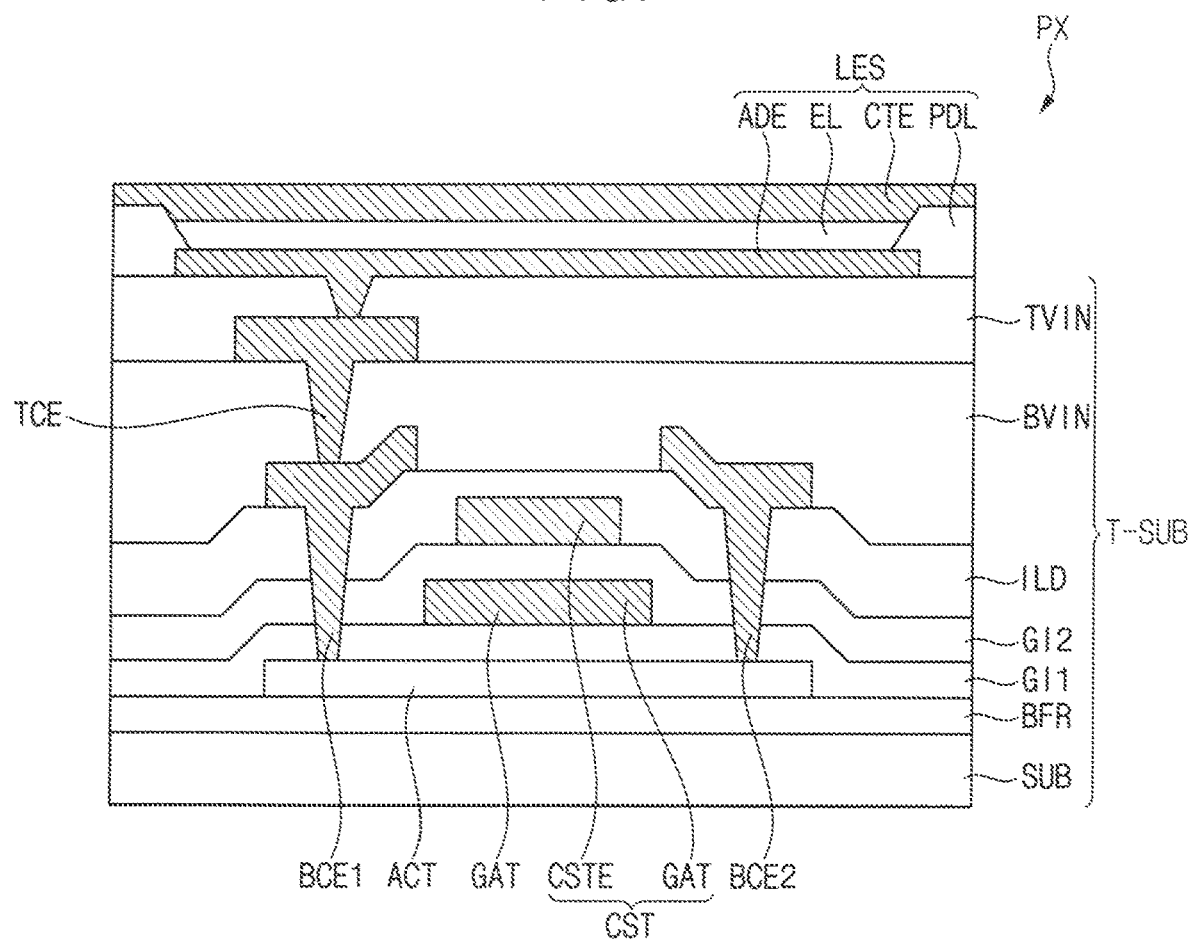
FIG. 4 is a cross-sectional view illustrating a pixel included in the display device of FIG. 2.

FIG. 3 is a circuit diagram illustrating a pixel included in the display device of FIG. 2. FIG. 4 is a cross-sectional view illustrating a pixel included in the display device of FIG. 2.

Referring to FIGS. 2 and 3, the pixel PX may include a pixel circuit PC and at least one organic light emitting diode OLED. The pixel circuit PC may provide a driving current to the organic light emitting diode OLED.

In an example embodiment, the pixel circuit PC may include a plurality of transistors and at least one storage capacitor. For example, the pixel circuit PC may include a first transistor T1, a second transistor T2, a third transistor T3, a fourth transistor T4, a fifth transistor T5, a sixth transistor. T6, a seventh transistor T7, and a storage capacitor CST. The first transistor T1 may be referred to as a driving transistor, the second transistor T2 may be referred to as a switching transistor, the third transistor T3 may be referred to as a compensation transistor, and the fourth transistor T4 may be referred to as an initialization transistor, the fifth and sixth transistors T5 and T6 may be referred to as emission control transistors, and the seventh transistor T7 may be referred to as an anode initialization transistor.

The first transistor T1 may include a gate terminal, a first terminal (e.g., a source terminal), and a second terminal (e.g., a drain terminal). The gate terminal of the first transistor T1 may be connected to the storage capacitor CST. The first terminal of the first transistor T1 may receive the high power voltage EVLDD. The second terminal of the first transistor T1 may be connected to the sixth transistor T6. The first transistor T1 may generate the driving current based on the high power voltage ELVDD and the data voltage DATA.

The second transistor T2 may include a gate terminal, a first terminal (e.g., a source terminal), and a second terminal (e.g., a drain terminal). The gate terminal of the second transistor T2 may receive the first gate signal GW through the gate line GL. The first terminal of the second transistor T2 may receive the data voltage DATA. The second terminal of the second transistor T2 may provide the data voltage DATA to the first transistor T1.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level.

The third transistor T3 may include a gate terminal, a first terminal (e.g., a source terminal), and a second terminal (e.g., a drain terminal). The gate terminal of the third transistor T3 may receive the first gate signal GW. The first terminal of the third transistor T3 may be connected to the second terminal of the first transistor T1, and the second terminal of the third transistor T3 may be connected to the gate terminal of the first transistor.

The third transistor T3 may be turned on or off in response to the first gate signal GW. For example, when the third transistor T3 is a PMOS transistor, the third transistor T3 may be turned on when the first gate signal GW has a negative voltage level, and may be turned off when the first gate signal GW has a positive voltage level. During a period in which the third transistor T3 is turned on in response to the first gate signal GW, the third transistor T3 may diode-connect the first transistor T1. Accordingly, the third transistor T3 may compensate for a threshold voltage of the first transistor T1.

The fourth transistor T4 may include a gate terminal, a first terminal (e.g., a source terminal), and a second terminal (e.g., a drain terminal). The gate terminal of the fourth transistor T4 may receive the second gate signal GC. The fourth transistor T4 may transmit the initialization voltage VINT to the gate terminal of the first transistor T1.

The fourth transistor T4 may be turned on or off in response to the second gate signal GC. For example, when the fourth transistor T4 is a PMOS transistor, the fourth transistor T4 may be turned on when the second gate signal GC has a negative voltage level, and may be turned off when the second gate signal GC has a positive voltage level.

While the fourth transistor T4 is turned on in response to the second gate signal GC, the initialization voltage VINT may be provided to the gate terminal of the first transistor T1. Accordingly, the gate terminal of the first transistor T1 may be initialized to the initialization voltage VINT.

The fifth transistor T5 may include a gate terminal, a first terminal (e.g., a source terminal), and a second terminal (e.g., a drain terminal). The gate terminal of the fifth transistor T5 may receive the emission driving signal EM. The first terminal of the fifth transistor T5 may receive the high power voltage ELVDD. The second terminal of the fifth transistor T5 may be connected to the first transistor T1. When the fifth transistor T5 is turned on in response to the emission driving signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission driving signal EM. The first terminal of the sixth transistor T6 may be connected to the first transistor T1. The second terminal of the sixth transistor T6 may be connected to the organic light emitting diode OLED. When the sixth transistor T6 is turned on in response to the emission driving signal EM, the sixth transistor T6 may provide the driving current to the organic light emitting diode OLED.

The seventh transistor T7 may include a gate terminal, a first terminal (e.g., a source terminal), and a second terminal (e.g., a drain terminal). The gate terminal of the seventh transistor T7 may receive the third gate signal GB. The second terminal of the seventh transistor T7 may receive the initialization voltage VINT. The first terminal of the seventh transistor T7 may be connected to the organic light emitting diode OLED. When the seventh transistor T7 is turned on in response to the third gate signal GB, the seventh transistor T7 may provide the initialization voltage VINT to the organic light emitting diode OLED. Accordingly, the seventh transistor T7 may initialize a first terminal of the organic light emitting diode OLED to the initialization voltage VINT.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain a voltage level of the gate terminal of the first transistor T1 during an inactive period of the first gate signal GW.

The organic light emitting diode OLED may include a first terminal (e.g., an anode terminal) and a second terminal (e.g., a cathode terminal). The first terminal of the organic light emitting diode OLED may receive the driving current, and the second terminal may receive the low power voltage ELVSS. The organic light emitting diode OLED may generate light having a luminance corresponding to the driving current.

Meanwhile, a connection structure between the pixel circuit PC and the organic light emitting diode OLED shown in FIG. 3 is example and may be variously changed.

Referring to FIGS. 2 and 4, the pixel PX may include a transistor substrate T-SUB and an emission structure LES disposed on the transistor substrate T-SUB.

The transistor substrate T-SUB may include a base substrate SUB, a buffer layer BFR, an active pattern ACT, a first gate insulating layer GI1, a gate electrode GAT, a second gate insulating layer GI2, a storage capacitor electrode CSTE, an interlayer insulating layer ILD, a first connection electrode BCE1, a second connection electrode BCE2, a first planarization layer BVIN, a third connection electrode TCE, and a second planarization layer TVIN.

The emission structure LES may include a first electrode ADE, a pixel defining layer PDL, an emission layer EL, and a second electrode CTE.

The base substrate SUB may include glass, quartz, plastic, or the like. In an example embodiment, when the display device DD1 is a rigid display device, the base substrate SUB may include glass. In another example embodiment, when the display device DD1 is a flexible display device, the base substrate SUB may include plastic.

The buffer layer BFR may be disposed on the base substrate SUB. The buffer layer BFR may include an inorganic material. The buffer layer BFR may prevent diffusion of impurities into the active pattern ACT, and the active pattern ACT may be uniformly formed.

The active pattern ACT may be disposed on the buffer layer BFR. The active pattern ACT may include an amorphous silicon semiconductor, a polycrystalline silicon semiconductor, an oxide semiconductor, or the like. The active pattern ACT may be partially doped and thus may have conductivity.

The first gate insulating layer GI1 may be disposed on the active pattern ACT. The first gate insulating layer GI1 may cover the active pattern ACT. In an example embodiment, the first gate insulating layer GI1 may include an inorganic material. For example, the first gate insulating layer GI1 may include silicon oxide ("SiOx"), silicon nitride ("SiNx"), or the like.

The gate electrode GAT may be disposed on the first gate insulating layer GI1. The gate electrode GAT may overlap the active pattern ACT. In an example embodiment, the gate electrode GAT may include a metal, an alloy, a conductive metal oxide, a transparent conductive material, or the like. For example, the gate electrode GAT may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second gate insulating layer GI2 may be disposed on the gate electrode GAT. The second gate insulating layer GI2 may cover the gate electrode GAT. In an example embodiment, the second gate insulating layer GI2 may include an inorganic material.

The storage capacitor electrode CSTE may be disposed on the second gate insulating layer GI2. The storage capacitor electrode CSTE may overlap the gate electrode GAT. The storage capacitor electrode CSTE may constitute the storage capacitor CST together with the gate electrode GAT. In an example embodiment, the storage capacitor electrode CSTE may include a metal, an alloy, a conductive metal oxide, a transparent conductive material, or the like.

The interlayer insulating layer ILD may be disposed on the storage capacitor electrode CSTE. The interlayer insulating layer ILD may cover the storage capacitor electrode CSTE. In an example embodiment, the interlayer insulating layer ILD may include an inorganic material.

The first and second connection electrodes BCE1 and BCE2 may be disposed on the interlayer insulating layer ILD. The first and second connection electrodes BCE1 and BCE2 may contact the active pattern ACT through contact holes respectively. In an example embodiment, the first and second connection electrodes BCE1 and BCE2 may include a metal, an alloy, a conductive metal oxide, a transparent conductive material, and the like. For example, the first and second connection electrodes BCE1 and BCE2 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The first planarization layer BVIN may be disposed on the interlayer insulating layer ILD. The first planarization layer BVIN may cover the first and second connection electrodes BCE1 and BCE2. In an example embodiment, the first planarization layer BVIN may include an organic material. For example, the first planarization layer BVIN may include a photoresist, a polyacrylic resin, a polyimide resin, an acrylic resin, or the like.

The third connection electrode TCE may be disposed on the first planarization layer BVIN. The third connection electrode TCE may contact the first connection electrode BCE1 through a contact hole. The third connection electrode TCE may include a metal, an alloy, a conductive metal oxide, a transparent conductive material, and the like. However, the third connection electrode TCE may not contact the second connection electrode BCE2.

The second planarization layer TVIN may be disposed on the first planarization layer BVIN. The second planarization layer TVIN may cover the third connection electrode TCE. In an example embodiment, the second planarization layer TVIN may include an organic material.

The emission structure LES may correspond to the organic light emitting diode OLED.

The first electrode ADE may be disposed on the second planarization layer TVIN. The first electrode ADE may contact the third connection electrode TCE through a contact hole. In an example embodiment, the first electrode ADE may include a metal, an alloy, a conductive metal oxide, or the like. For example, the first electrode ADE may include gold ("Au"), silver ("Ag"), copper ("Cu"), nickel ("Ni"), chromium ("Cr"), aluminum ("Al"), tungsten ("W"), molybdenum ("Mo"), titanium ("Ti"), tantalum ("Ta"), indium tin oxide ("ITO"), indium zinc oxide ("IZO"), and alloys thereof.

The pixel defining layer PDL may be disposed on the second planarization layer TVIN. An opening exposing an upper surface of the first electrode ADE may be formed in the pixel defining layer PDL. An opening exposing a bottom surface of second electrode CTE may be formed in the pixel defining layer PDL. The second electrode CTE overlaps the first electrode ADE, and the first electrode ADE overlaps the active pattern ACT, the gate electrode GAT, and the storage capacitor electrode CSTE.

The emission layer EL may be disposed on the first electrode ADE. The emission layer EL may be located in the opening formed in the pixel defining layer PDL. The emission layer EL is disposed between the first electrode ADE and the second electrode CTE, and may emit light.

The second electrode CTE may be disposed on the emission layer EL. The second electrode CTE may include a metal, an alloy, or a conductive metal oxide. For example, the second electrode CTE may include gold ("Au"), silver ("Ag"), copper ("Cu"), nickel ("Ni"), chromium ("Cr"), aluminum ("Al"), tungsten ("W"), molybdenum ("Mo"), titanium ("Ti"), tantalum ("Ta"), indium tin oxide ("ITO"), indium zinc oxide ("IZO"), and alloys thereof.

Figure 5:
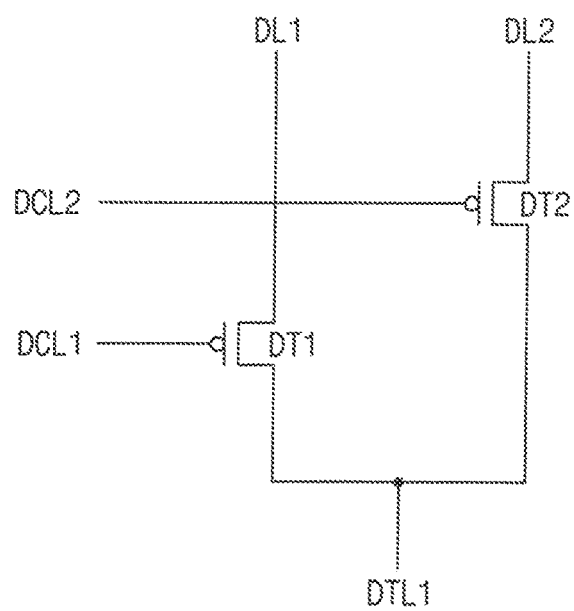
FIG. 5 is a circuit diagram illustrating a demultiplexer included in a demultiplexing circuit of the display device of FIG. 2.
Figure 6:
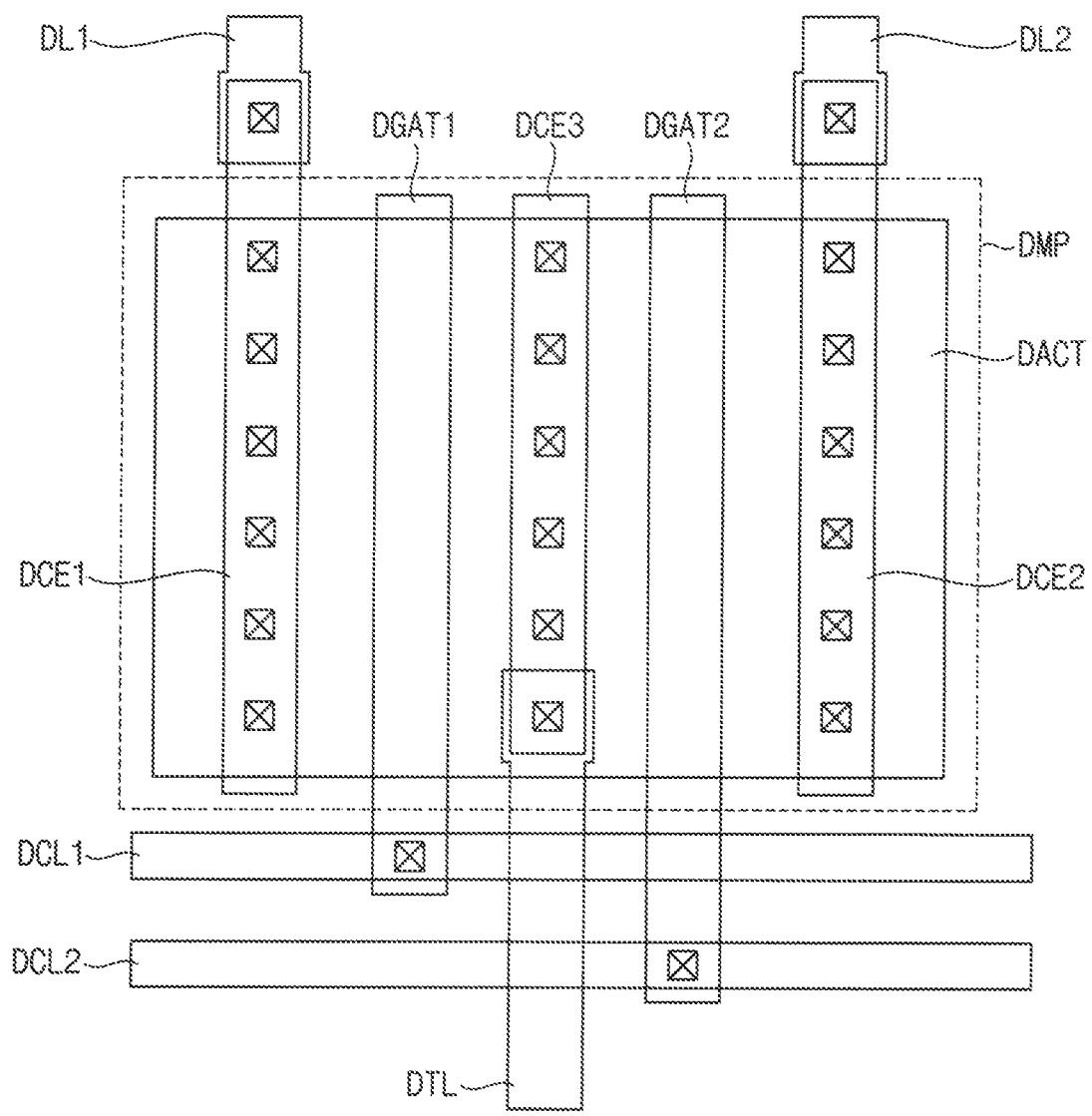
FIG. 6 is a layout diagram illustrating the demultiplexer of FIG. 5.

FIG. 5 is a circuit diagram illustrating a demultiplexer included in a demultiplexing circuit of the display device of FIG. 2. FIG. 6 is a layout diagram illustrating the demultiplexer of FIG. 5.

Referring to FIGS. 1, 2, and 5, the demultiplexer DMP may include a first demux transistor DT1 and a second demux transistor DT2. The demultiplexer DMP may sequentially transmit the data voltage DATA to the first and second data lines DL1 and DL2.

The first demux transistor DT1 may include a gate terminal, a first terminal (e.g., a source terminal), and a second terminal (e.g., a drain terminal). The gate terminal may be connected to a first demux gate line DCL1. The first terminal may be connected to the first data transmission line DTL1. The second terminal may be connected to the first data line DL1. The first demux transistor DT1 may be turned on or off in response to a first demux gate signal provided from the first demux gate line DCL1. While the first demux transistor DT1 is turned on, the data voltage DATA may be transferred from the first data transmission line DTL1 to the first data line DL1.

The second demux transistor DT2 may include a gate terminal, a first terminal (e.g., a source terminal), and a second terminal (e.g., a drain terminal). The gate terminal may be connected to a second demux gate line DCL2. The first terminal may be connected to the first data transmission line DTL1. The second terminal may be connected to the second data line DL2. The second demux transistor DT2 may be turned on or off in response to a second demux gate signal provided from the second demux gate line DCL2. While the second demux transistor DT2 is turned on, the data voltage DATA may be transferred from the first data transmission line DTL1 to the second data line DL2.

As the first demux transistor DT1 and the second demux transistor DT2 are sequentially turned on, the data voltage DATA of the first data transmission line DTL1 may be sequentially transmitted to the data lines DL1 and DL2.

Referring to FIGS. 1, 2, and 6, the demultiplexer DMP may include a demux active pattern DACT, a first demux gate electrode DGAT1, a second demux gate electrode DGAT2, a first demux connection electrode DCE1, a second demux connection electrode DCE2, and a third demux connection electrode DCE3.

The demux active pattern DACT may be disposed in the same layer as the active pattern ACT. The demux active pattern DACT may contact the first, second, and third demux connection electrodes DCE1, DCE2, and DCE3.

The first demux gate electrode DGAT1 may be disposed on the demux active pattern DACT. The first demux gate electrode DGAT1 may be disposed in the same layer as the gate electrode GAT. The first demux gate electrode DGAT1 may be connected to the first demux gate line DCL1. The first demux gate signal may be provided to the first demux gate electrode DGAT1 through the first demux gate line DCL1.

The second demux gate electrode DGAT2 may be disposed on the demux active pattern DACT. The second demux gate electrode DGAT2 may be disposed in the same layer as the first demux gate electrode DGAT1. The second demux gate electrode DGAT2 may be connected to the second demux gate line DCL2. The second demux gate signal may be provided to the second demux gate electrode DGAT2 through the second demux gate line DCL2.

The first demux connection electrode DCE1 may be disposed on the demux active pattern DACT. The first demux connection electrode DCE1 may be disposed in the same layer as the first connection electrode BCE1. The first demux connection electrode DCE1 may receive the data voltage DATA from the demux active pattern DACT. In addition, the first demux connection electrode DCE1 may be connected to the first data line DL1. The first demux connection electrode DCE1 may provide the data voltage DATA to the first data line DL1.

The second demux connection electrode DCE2 may be disposed on the demux active pattern DACT. The second demux connection electrode DCE2 may be disposed in the same layer as the first demux connection electrode DCE1. The second demux connection electrode DCE2 may receive the data voltage DATA from the demux active pattern DACT. In addition, the second demux connection electrode DCE2 may be connected to the second data line DL2. The second demux connection electrode DCE2 may provide the data voltage DATA to the second data line DL2.

The third demux connection electrode DCE3 may be disposed on the demux active pattern DACT. The third demux connection electrode DCE3 may be disposed in the same layer as the first and second demux connection electrodes DCE1 and DCE2. The third demux connection electrode DCE3 may receive the data voltage DATA from the first data transmission line DTL1. In addition, the third demux connection electrode DCE3 may be connected to the demux active pattern DACT. The third demux connection electrode DCE3 may provide the data voltage DATA through the demux active pattern DACT.

Figure 7:
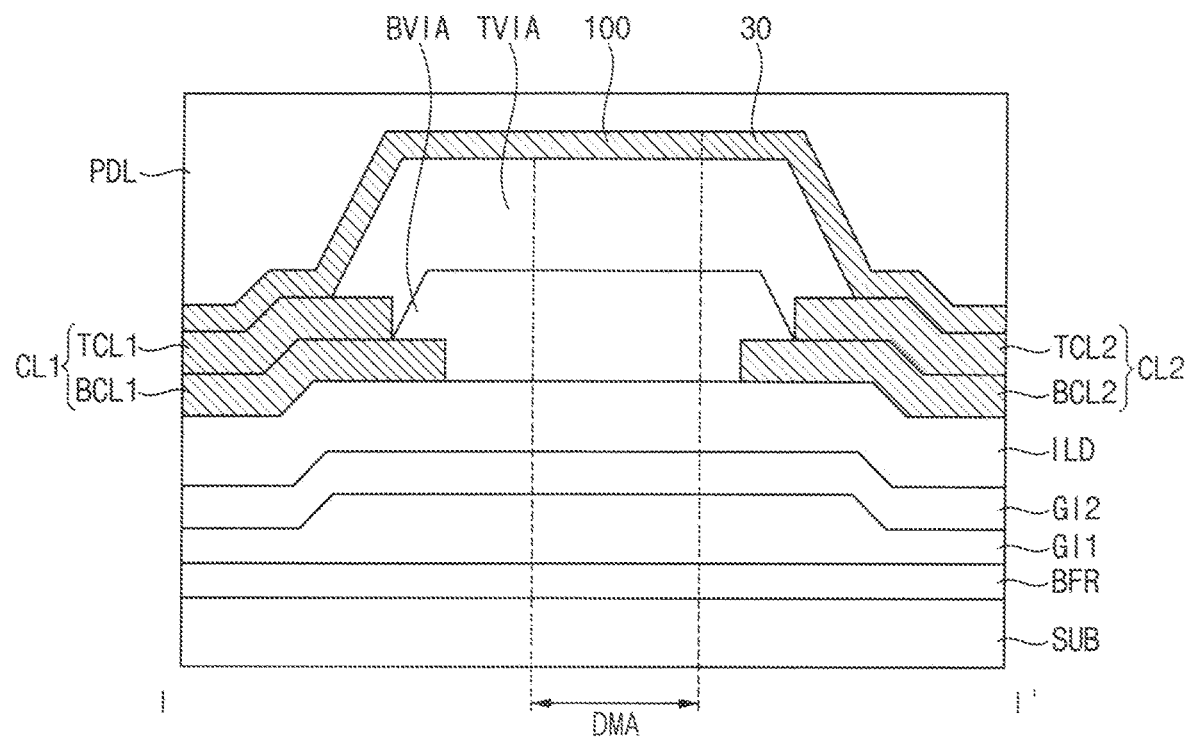
FIG. 7 is a cross-sectional view taken along line I-I' of FIG. 2.
Figure 8:
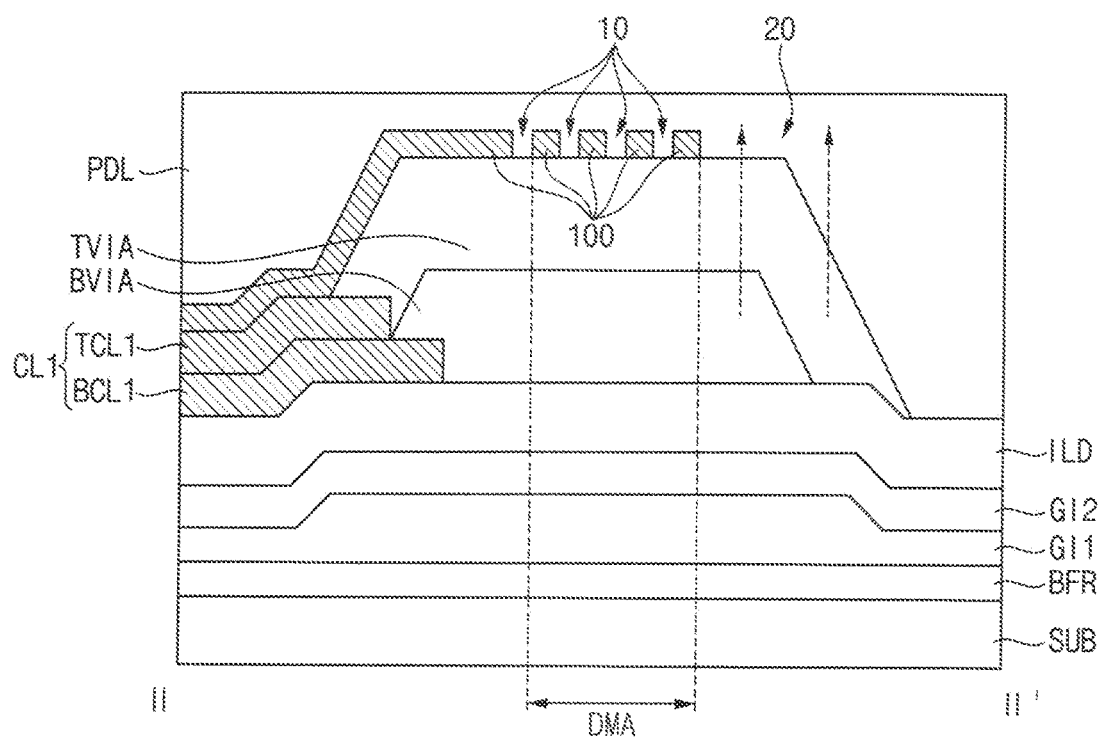
FIG. 8 is a cross-sectional view taken along line II-II' of FIG. 2.

FIG. 7 is a cross-sectional view taken along line I-I' of FIG. 2. FIG. 8 is a cross-sectional view taken along line II-II' of FIG. 2.

Referring to FIGS. 2 and 7, the display device DD1 may include the base substrate SUB, the buffer layer BFR, the first gate insulating layer GI1, the second gate insulating layer GI2, the interlayer. Insulating layer ILD, a first connection line CL1, a second connection line CL2, a first organic insulating layer BVIA, a second organic insulating layer TVIA, the first portion 100, the protruded portion 30, and the pixel defining layer PDL.

The first connection line CL1 may be electrically connected to the power provider PPV. The first connection line CL1 may transmit the constant voltage from the power provider PPV to the first portion 100.

The first connection line CL1 may include a first lower connection line BCL1 and a first upper connection line TCL1. The first lower connection line BCL1 and the first upper connection line TCL1 may contact each other. The first lower connection line BCL1 may be disposed in the same layer as the first connection electrode BCE1 (as shown in FIG. 4), and the first upper connection line TCL1 may be disposed in the same layer as the third connection electrode TCE (as shown in FIG. 4).

The second connection line CL2 may be electrically connected to the pixel part PXP. For example, the second connection line CL2 may be disposed under the protruded portion 30 and may overlap the protruded portion 30. The second connection line CL2 may transmit the constant voltage from the protruded portion 30 to the pixel part PXP.

The second connection line CL2 may include a second lower connection line BCL2 and a second upper connection line TCL2. The second lower connection line BCL2 and the second upper connection line TCL2 may contact each other. The second lower connection line BCL2 may be disposed in the same layer as the first connection electrode BCE1 (as shown in FIG. 4), and the second upper connection line TCL2 may be disposed in the same layer as the third connection electrode TCE (as shown in FIG. 4).

The first organic insulating layer BVIA may be disposed in the same layer as the first planarization layer BVIN (as shown in FIG. 4), and may include an organic material. The second organic insulating layer TVIA may contact the first organic insulating layer BVIA, may be disposed in the same layer as the second planarization layer TVIN (as shown in FIG. 4), and may include an organic material. The first and second organic insulating layers BVIA and TVIA may electrically insulate the demultiplexing circuit part DCP and the first connection pattern 1000.

The first portion 100 may contact the first connection line CL1 and may overlap the demultiplexing circuit part DCP. For example, an area overlapping the demultiplexing circuit part DCP may be defined as an overlapping area DMA. In other words, the first portion 100 may overlap the overlapping area DMA.

The protruded portion 30 may extend from the first portion 100 and may contact the second connection line CL2. The protruded portion 30 may not overlap the overlapping area DMA. In addition, the protruded portion 30 may cover an upper surface of the second organic insulating layer TVIA and a side surface of the second organic insulating layer TVIA. Accordingly, the protruded portion 30 may electrically connect the first portion 100 and the second connection line CL2. The constant voltage may be transmitted to the pixel part PXP through the first connection line CL1, the first portion 100, the protruded portion 30, and the second connection line CL2.

The pixel defining layer PDL may cover the first portion 100 and the protruded portion 30.

Referring to FIGS. 2 and 8, the display device DD1 may include the base substrate SUB, the buffer layer BFR, the first gate insulating layer GI1, the second gate insulating layer GI2, the interlayer insulating layer ILD, the first connection line CL1, the first organic insulating layer BVIA, the second organic insulating layer TVIA, the first portion 100, and the second portion 200. The first penetration holes 10 may be formed in the first portion 100, and the second penetration holes 20 may be formed in the second portion 200.

The first penetration hole 10 may vertically penetrate the first portion 100. The first penetration hole 10 may expose an upper surface of the second organic insulating layer TVIA. Gas generated in the second organic insulating layer TVIA may be discharged in a direction perpendicular to the second organic insulating layer TVIA through the first penetration hole 10.

The second penetration hole 20 may vertically penetrate the second portion 200. The second penetration hole 20 may expose an upper surface of the second organic insulating layer TVIA and a side surface of the second organic insulating layer TVIA. Accordingly, gas generated from the second organic insulating layer TVIA may be discharged in a direction perpendicular to the second organic insulating layer TVIA. In other words, gas generated in the second organic insulating layer TVIA may not be discharged to the pixel part PXP. Accordingly, the pixels PX adjacent to the second portion 200 (e.g., pixels disposed in the area A shown in FIG. 2) may not be deteriorated, and pixel shrinkage defect may be prevented.

Figure 9:
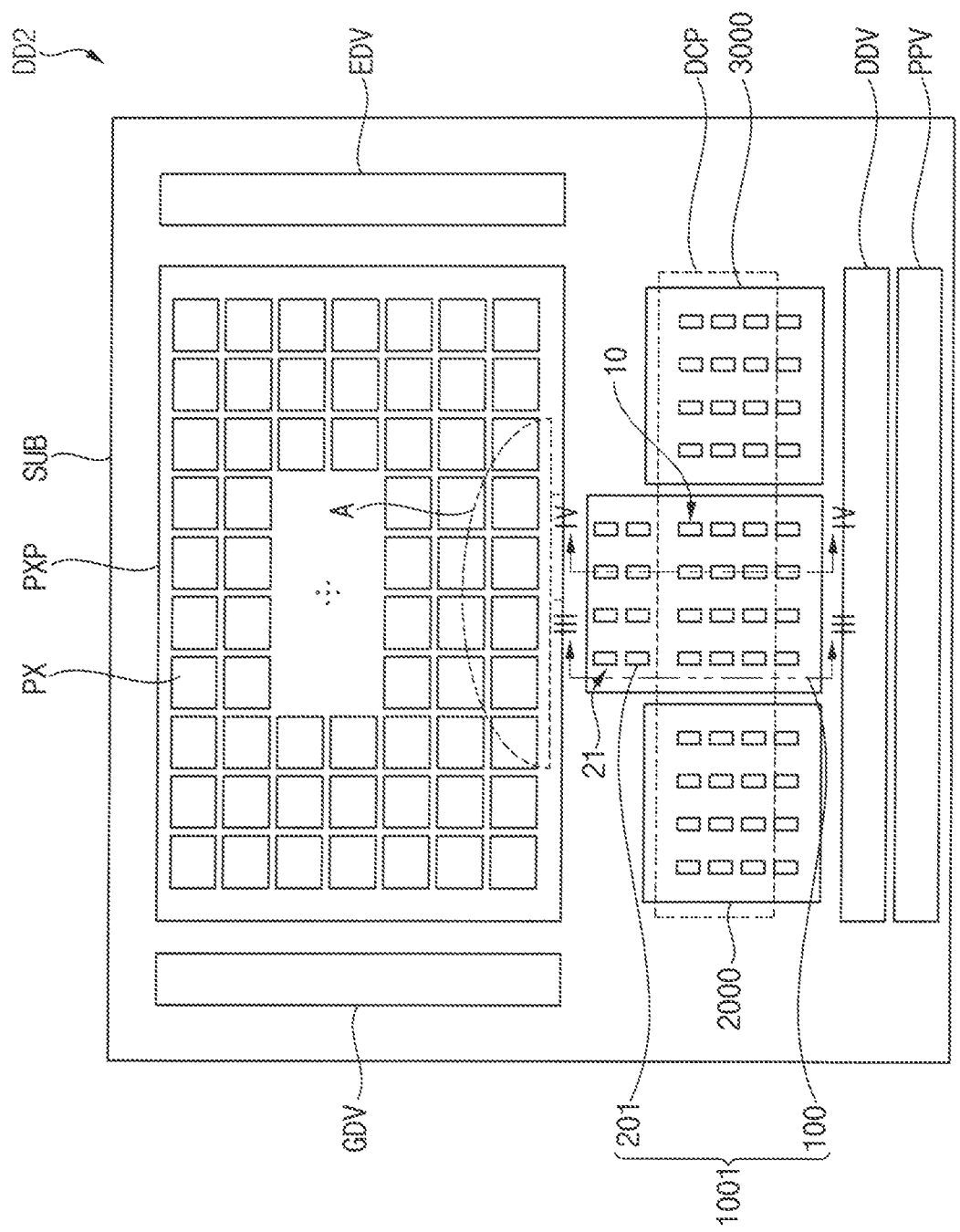
FIG. 9 is a plan view illustrating a display device according to another example embodiment.
Figure 10:
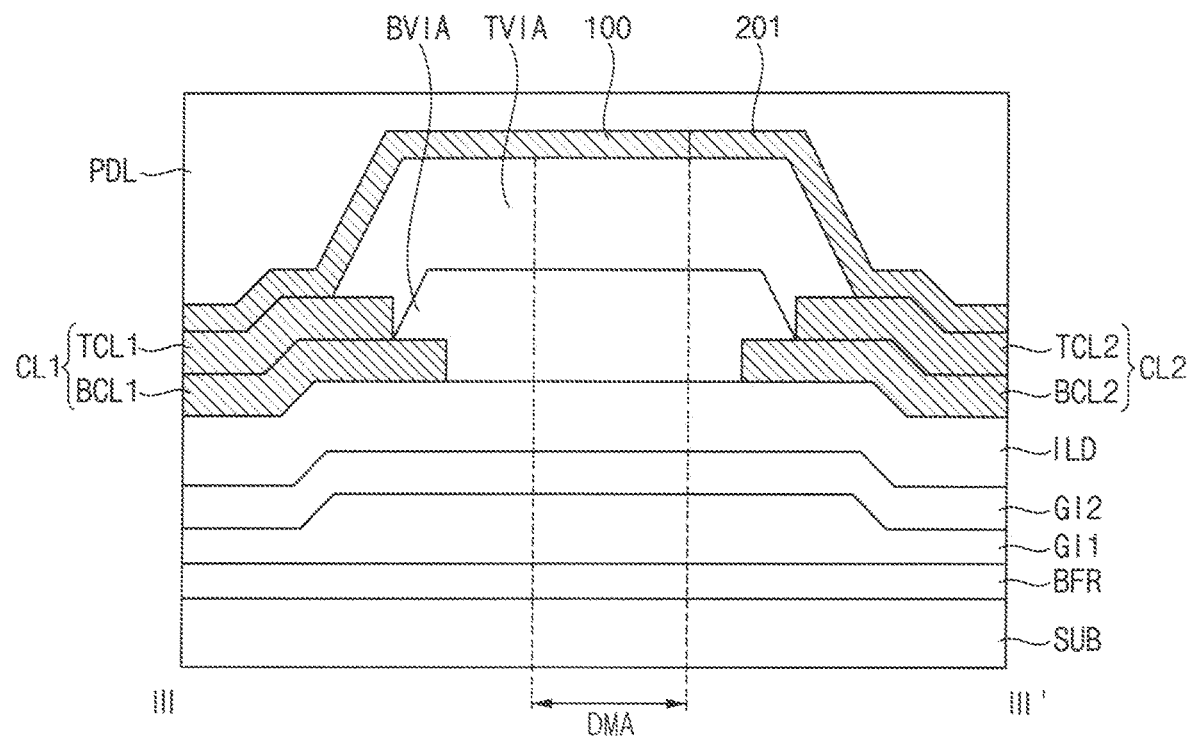
FIG. 10 is a cross-sectional view taken along line III-III' of FIG. 9.
Figure 11:
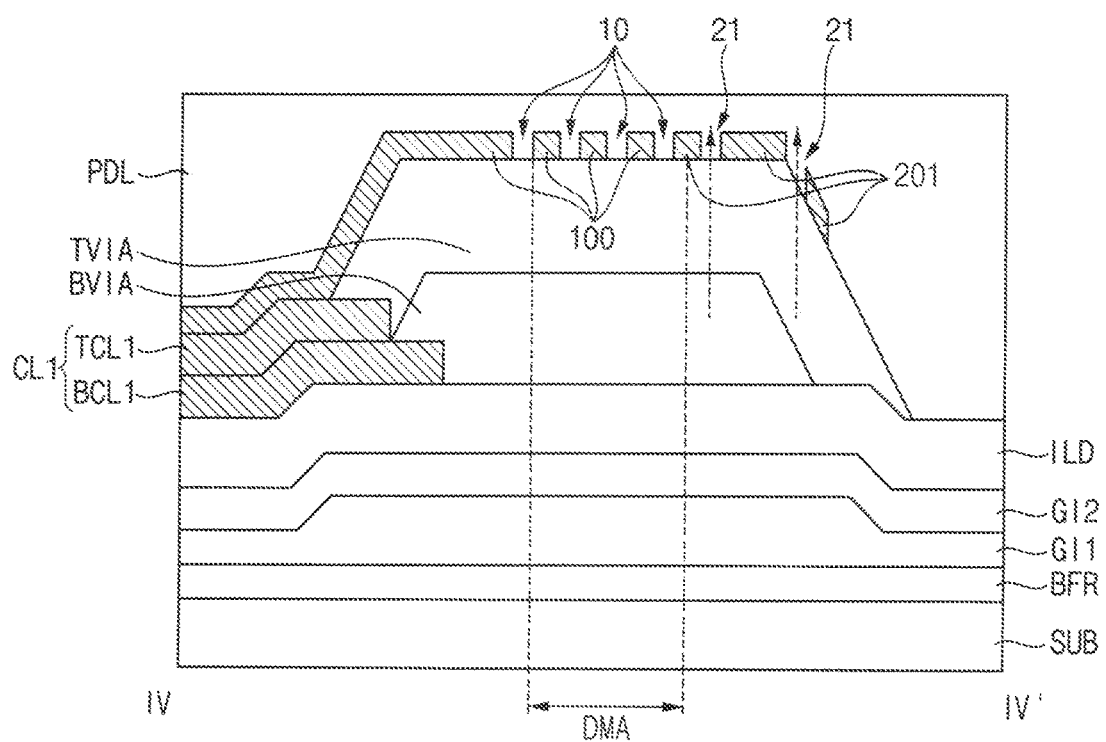
FIG. 11 is a cross-sectional view taken along line IV-IV' of FIG. 9.

FIG. 9 is a plan view illustrating a display device according to another example embodiment. FIG. 10 is a cross-sectional view taken along line III-III' of FIG. 9. FIG. 11 is a cross-sectional view taken along line IV-IV' of FIG. 9.

Referring to FIG. 9, a display device DD2 according to another example embodiment may include the pixel part PXP, the gate driver GDV, the emission driver EDV, the demultiplexing circuit part DCP, the data driver DDV, the power provider PPV, and connection patterns. For example, the connection patterns may include a first connection pattern 1001, the second connection pattern 2000, and the third connection pattern 3000. However, the display device DD2 may be substantially the same as the display device DD1 described with reference to FIG. 2 except for the first connection pattern 1001. Hereinafter, the first connection pattern 1001 will be described.

In an example embodiment, the first connection pattern 1001 may be disposed between the second connection pattern 2000 and the third connection pattern 3000. The second connection pattern 2000 may be disposed adjacent to a left side of the first connection pattern 1001, and the third connection pattern 3000 may be disposed adjacent to a right side of the first connection pattern 1001. In addition, the first connection pattern 1001 may be disposed closer to the pixel part PXP than the second and third connection patterns 2000 and 3000. However, the arrangement structure of the first to third connection patterns 1001, 2000, and 3000 is not limited to the above. For example, the second connection pattern 2000 may be disposed closer to the pixel part PXP than the first and third connection patterns 1001 and 3000, or the third connection pattern 300 may be disposed closer to the pixel part PXP than the first and second connection patterns 1001 and 2000.

In an example embodiment, each of the first, second, and third connection patterns 1001, 2000, and 3000 may receive the constant voltage from the power provider PPV, and may transmit the constant voltage to the pixel part PXP. For example, the first connection pattern 1001 may receive a first constant voltage from the power provider PPV, and may transmit the first constant voltage to the pixel part PXP. The second connection pattern 2000 may receive a second constant voltage from the power provider PPV and may transmit the second constant voltage to the pixel part PXP. The third connection pattern 3000 may receive a third constant voltage from the power provider PPV, and may transmit the third constant voltage to the pixel part PXP. For example, the first constant voltage may be the initialization voltage VINT, the second constant voltage may be the high power voltage ELVDD, and the third constant voltage may be the low power voltage ELVSS. However, the first, second, and third constant voltages are not limited to those described above.

In an example embodiment, the first, second, and third connection patterns 1001, 2000, and 3000 may be disposed on the demultiplexing circuit part DCP. For example, the first, second, and third connection patterns 1001, 2000, and 3000 may overlap the demultiplexing circuit part DCP and may cover the demultiplexing circuit part DCP. For example, the demultiplexing circuit part DCP may be formed of an active pattern, a first metal layer disposed on the active pattern, and a second metal layer disposed on the first metal layer, and the first, second, and third connection patterns 1001, 2000, and 3000 may be formed of a third metal layer disposed on the second metal layer. The demultiplexing circuit part DCP may be protected by the first, second, and third connection patterns 1001, 2000, and 3000 covering the demultiplexing circuit part DCP. For example, as the first connection pattern 1001 to which the first constant voltage is provided overlaps the demultiplexing circuit part DCP, the first connection pattern 1001 may protect the demultiplexing circuit part DCP from static electricity generated around the demultiplexing circuit part DCP.

In an example embodiment, the first connection pattern 1001 may include the first portion 100 and the second portion 201. The first portion 100 may overlap the demultiplexing circuit part DCP. The second portion 201 may be disposed between the first portion 100 and the pixel part PXP. For example, the second portion 201 may extend from the first portion 100 toward the pixel part PXP.

In an example embodiment, an organic insulating layer including an organic material may be disposed on the demultiplexing circuit part DCP, and the first connection pattern 1001 may be disposed on the organic insulating layer. A plurality of first penetration holes 10 vertically penetrating the first portion 100 along the thickness direction (third direction D3) may be formed in the first portion 100. The first penetration holes 10 may expose an upper surface of the organic insulating layer. In addition, a plurality of second penetration holes 21 vertically penetrating the second portion 201 along the thickness direction (third direction D3) may be formed in the second portion 201. An area of each of the second penetration holes 21 may be equal to an area of each of the first penetration holes 10.

In an example embodiment, each of the second penetration holes 21 may expose an upper surface of the organic insulating layer and a side surface of the organic insulating layer.

The display device DD2 may include the first connection pattern 1001 in which the first and second penetration holes 10 and 21 are formed. Outgassing of the organic insulating layer disposed under the first connection pattern 1001 may be smoothly performed through the first and second penetration holes 10 and 21. For example, the display device DD2 may include a second portion 201 in which the second penetration holes 21 are formed. Accordingly, the gas discharged from the organic insulating layer may be discharged in a direction perpendicular to the organic insulating layer. In other words, the gas discharged from the organic insulating layer may not be discharged to the pixel part PXP. Accordingly, the pixels PX adjacent to the second portion 201 (e.g., pixels arranged in the area A shown in FIG. 9) may not be deteriorated, and pixel shrinkage defect may be prevented.

Referring to FIGS. 9 and 10, the display device DD2 may include the base substrate SUB, the buffer layer BFR, the first gate insulating layer GI1, the second gate insulating layer GI2, the interlayer insulating layer ILD, the first connection line CL1, the second connection line CL2, the first organic insulating layer BVIA, the second organic insulating layer TVIA, and the first portion 100, the second portion 201, and the pixel defining layer PDL. However, the base substrate SUB, the buffer layer BFR, the first gate insulating layer GI1, the second gate insulating layer GI2, the interlayer insulating layer ILD, the first connection line CL1, the first organic insulating layer BVIA, the second organic insulating layer TVIA, the first portion 100, and the pixel defining layer PDL may be the same as described above. Hereinafter, the second connection line CL2 and the second portion 201 will be described.

The second connection line CL2 may be electrically connected to the pixel part PXP. For example, the second connection line CL2 may be disposed under the second portion 201 and may contact the second portion 201. The second connection line CL2 may transmit the constant voltage from the second portion 201 to the pixel part PXP.

The first portion 100 may extend to contact the first connection line CL1. The second portion 201 may extend from the first portion 100 and may contact the second connection line CL2. The second portion 201 may not overlap the overlapping area DMA. In addition, the second portion 201 may cover an upper surface of the second organic insulating layer TVIA and a side surface of the second organic insulating layer TVIA. Accordingly, the second portion 201 may electrically connect the first portion 100 and the second connection line CL2 to each other. The constant voltage may be provided to the pixel part PXP through the first connection line CL1, the first portion 100, the second portion 201, and the second connection line CL2.

Referring to FIGS. 9 and 11, the display device DD2 may include the base substrate SUB, the buffer layer BFR, the first gate insulating layer GI1, the second gate insulating layer GI2, the interlayer insulating layer ILD, the first connection line CL1, the first organic insulating layer BVIA, the second organic insulating layer TVIA, the first portion 100, and the second portion 201. The first penetration holes 10 may be formed in the first portion 100, and the second penetration holes 21 may be formed in the second portion 201.

The first penetration hole 10 may vertically penetrate the first portion 100. The first penetration hole 10 may expose an upper surface of the second organic insulating layer TVIA. Gas generated in the second organic insulating layer TVIA may be discharged in a direction perpendicular to the second organic insulating layer TVIA through the first penetration hole 10.

The second penetration hole 21 may vertically penetrate the second portion 201. The second penetration hole 21 may expose an upper surface of the second organic insulating layer TVIA and a side surface of the second organic insulating layer TVIA. Accordingly, gas generated in the second organic insulating layer TVIA may be discharged in a direction perpendicular to the second organic insulating layer TVIA. In other words, gas generated in the second organic insulating layer TVIA may not be discharged to the pixel part PXP. Accordingly, the pixels PX adjacent to the second portion 201 (e.g., pixels arranged in the area A shown in FIG. 9) may not be deteriorated, and pixel shrinkage defect may be prevented.

Figure 12:
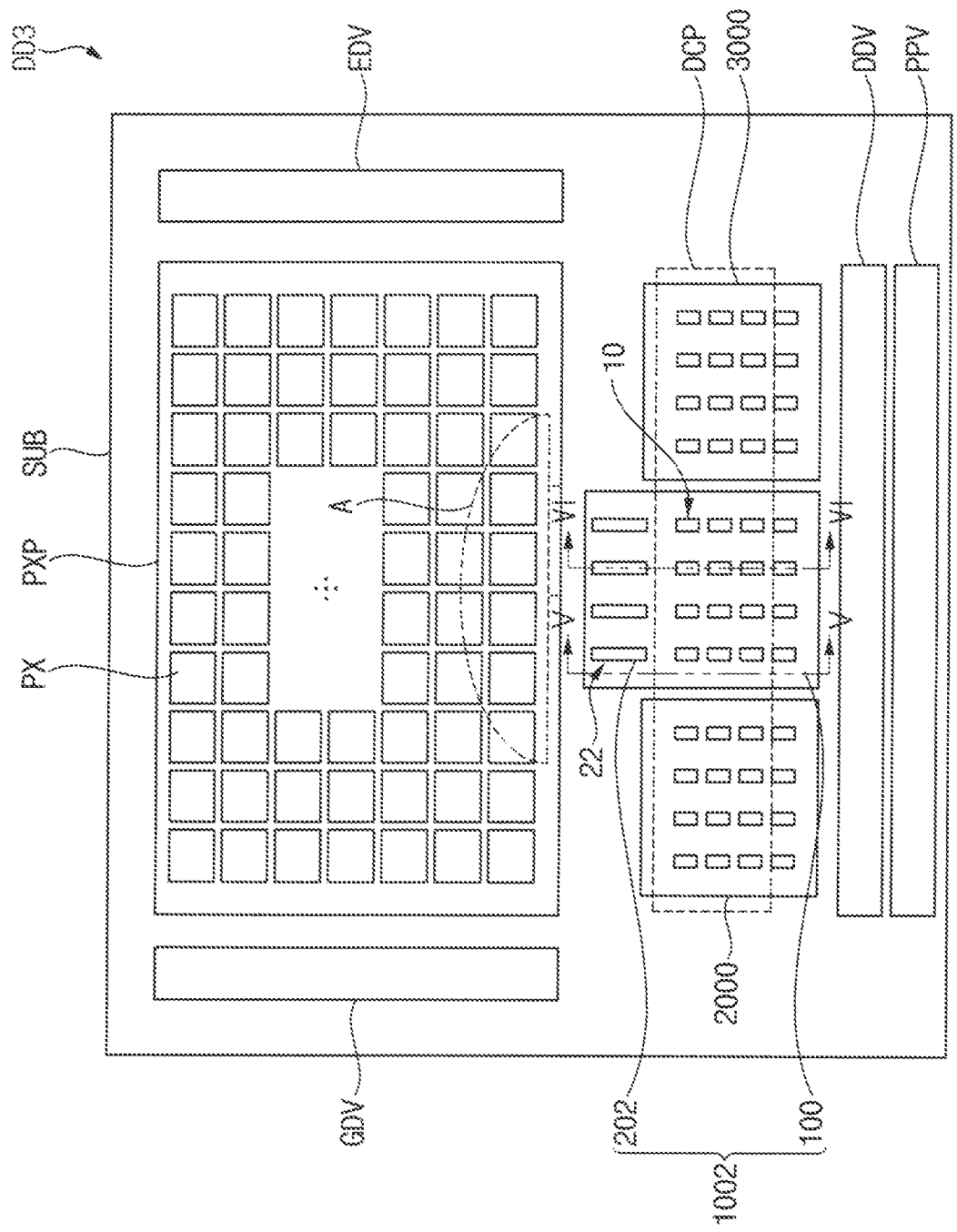
FIG. 12 is a plan view illustrating a display device according to still another example embodiment.
Figure 13:
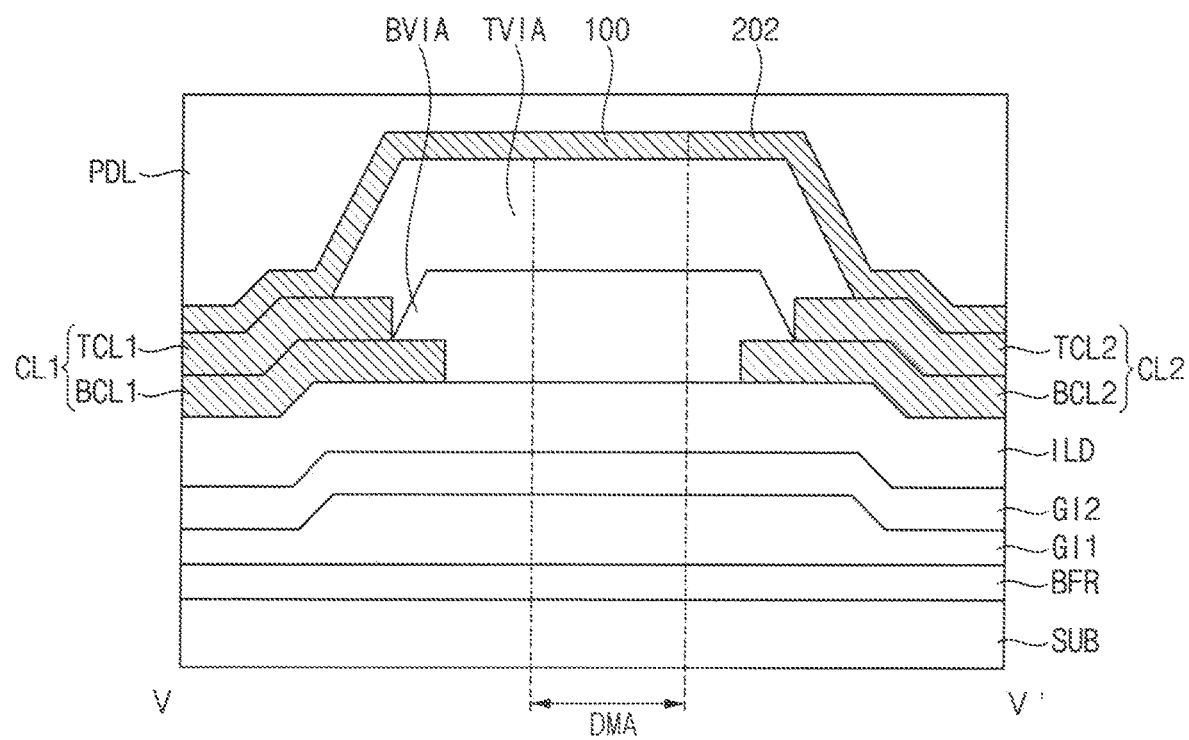
FIG. 13 is a cross-sectional view taken along line V-V' of FIG. 12.
Figure 14:
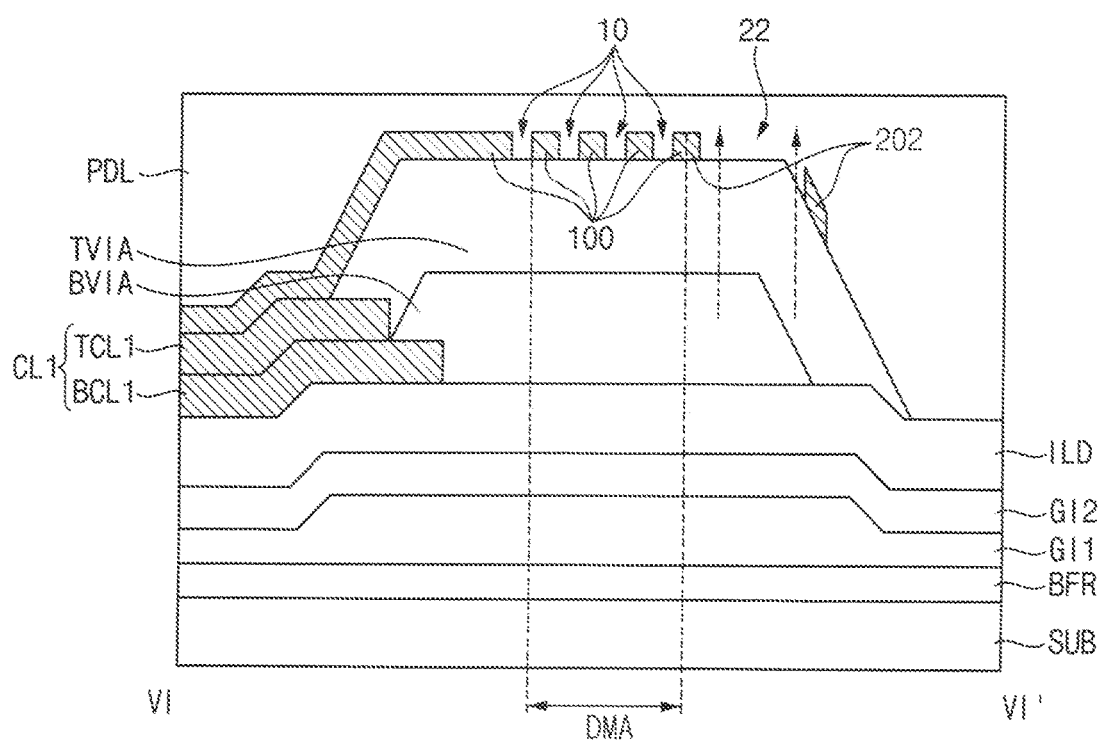
FIG. 14 is a cross-sectional view taken along line VI-VI' of FIG. 12.

FIG. 12 is a plan view illustrating a display device according to still another example embodiment. FIG. 13 is a cross-sectional view taken along line V-V' of FIG. 12. FIG. 14 is a cross-sectional view taken along line VI-VI' of FIG. 12.

Referring to FIG. 12, a display device DD3 according to another example embodiment may include the pixel part PXP, the gate driver GDV, the emission driver EDV, the demultiplexing circuit part DCP, the data driver DDV, the power provider PPV, and connection patterns. For example, the connection patterns may include a first connection pattern 1002, the second connection pattern 2000, and the third connection pattern 3000. However, the display device DD3 may be substantially the same as the display device DD1 described with reference to FIG. 2 except for the first connection pattern 1002. Hereinafter, the first connection pattern 1002 will be described.

In an example embodiment, the first connection pattern 1002 may be disposed between the second connection pattern 2000 and the third connection pattern 3000. The second connection pattern 2000 may be disposed adjacent to a left side of the first connection pattern 1002, and the third connection pattern 3000 may be disposed adjacent to a right side of the first connection pattern 1002. In addition, the first connection pattern 1002 may be disposed closer to the pixel part PXP than the second and third connection patterns 2000 and 3000. However, the arrangement structure of the first to third connection patterns 1002, 2000, and 3000 is not limited to the above. For example, the second connection pattern 2000 may be disposed closer to the pixel part PXP than the first and third connection patterns 1002 and 3000, or the third connection pattern 300 may be disposed closer to the pixel part PXP than the first and second connection patterns 1002 and 2000.

In an example embodiment, each of the first to third connection patterns 1002, 2000, and 3000 may receive the constant voltage from the power provider PPV, and may transmit the constant voltage to the pixel part PXP. For example, the first connection pattern 1002 may receive a first constant voltage from the power provider PPV, and may transmit the first constant voltage to the pixel part PXP. The second connection pattern 2000 may receive a second constant voltage from the power provider PPV and may transmit the second constant voltage to the pixel part PXP. The third connection pattern 3000 may receive a third constant voltage from the power provider PPV, and may transmit the third constant voltage to the pixel part PXP. For example, the first constant voltage may be the initialization voltage VINT, the second constant voltage may be the high power voltage ELVDD, and the third constant voltage may be the low power voltage ELVSS. However, the first, second, and third constant voltages are not limited to those described above.

In an example embodiment, the first, second and third connection patterns 1002, 2000, and 3000 may be disposed on the demultiplexing circuit part DCP. For example, the first, second, and third connection patterns 1002, 2000, and 3000 may overlap the demultiplexing circuit part DCP and may cover the demultiplexing circuit par DCP. For example, the demultiplexing circuit part DCP may be formed of an active pattern, a first metal layer disposed on the active pattern, and a second metal layer disposed on the first metal layer, and the first, second, and third connection patterns 1002, 2000, and 3000 may be formed of a third metal layer disposed on the second metal layer. The demultiplexing circuit part DCP may be protected by the first to third connection patterns 1002, 2000, and 3000 covering the demultiplexing circuit part DCP. For example, as the first connection pattern 1002 to which the first constant voltage is provided overlaps the demultiplexing circuit part DCP, the first connection pattern 1002 may protect the demultiplexing circuit part DCP from static electricity generated around the demultiplexing circuit part DCP.

In an example embodiment, the first connection pattern 1002 may include the first portion 100 and the second portion 202. The first portion 100 may overlap the demultiplexing circuit part DCP. The second portion 202 may be disposed between the first portion 100 and the pixel part PXP. For example, the second portion 202 may extend from the first portion 100 toward the pixel part PXP.

In an example embodiment, an organic insulating layer including an organic material may be disposed on the demultiplexing circuit part DCP, and the first connection pattern 1002 may be disposed on the organic insulating layer. The first penetration holes 10 vertically penetrating the first portion 100 may be formed in the first portion 100. The first penetration holes 10 may expose an upper surface of the organic insulating layer. In addition, a plurality of second penetration holes 22 vertically penetrating the second portion 202 may be formed in the second portion 202. An area of each of the second penetration holes 22 may be larger than an area of each of the first penetration holes 10.

In an example embodiment, each of the second penetration holes 22 may expose an upper surface of the organic insulating layer and a side surface of the organic insulating layer.

The display device DD3 may include the first connection pattern 1002 in which the first and second penetration holes 10 and 22 are formed. Outgassing of the organic insulating layer disposed under the first connection pattern 1002 may be smoothly performed through the first and second penetration holes 10 and 22. For example, the display device DD3 may include a second portion 202 in which the second penetration holes 22 are formed. Accordingly, the gas discharged from the organic insulating layer may be discharged in a direction perpendicular to the organic insulating layer. In other words, the gas discharged from the organic insulating layer may not be discharged to the pixel part PXP. Accordingly, the pixels PX adjacent to the second portion 202 (e.g., pixels disposed in the area A shown in FIG. 12) may not be deteriorated, and pixel shrinkage defect may be prevented.

Referring to FIGS. 12 and 13, the display device DD3 may include the base substrate SUB, the buffer layer BFR, the first gate insulating layer GI1, the second gate insulating layer GI2, and the interlayer insulating layer ILD, the first connection line CL1, the second connection line CL2, the first organic insulating layer BVIA, the second organic insulating layer TVIA, and the first portion 100, the second portion 202, and the pixel defining layer PDL. However, the base substrate SUB, the buffer layer BFR, the first gate insulating layer GI1, the second gate insulating layer GI2, the interlayer insulating layer ILD, the first connection line CL1, the first organic insulating layer BVIA, the second organic insulating layer TVIA, the first portion 100, and the pixel defining layer PDL may be the same as described above. Hereinafter, the second connection line CL2 and the second portion 202 will be described.

The second connection line CL2 may be electrically connected to the pixel part PXP. For example, the second connection line CL2 may be disposed under the second portion 202 and may contact the second portion 202. The second connection line CL2 may transmit the constant voltage from the second portion 202 to the pixel part PXP.

The first portion 100 may extend to contact the first connection line CL1. The second portion 202 may extend from the first portion 100 and may contact the second connection line CL2. The second portion 202 may not overlap the overlapping area DMA. In addition, the second portion 202 may cover an upper surface of the second organic insulating layer TVIA and a side surface of the second organic insulating layer TVIA. Accordingly, the second portion 202 may electrically connect the first portion 100 and the second connection line CL2. The constant voltage may be provided to the pixel part PXP through the first connection line CL1, the first portion 100, the second portion 202, and the second connection line CL2.

Referring to FIGS. 12 and 14, the display device DD3 may include the base substrate SUB, the buffer layer BFR, the first gate insulating layer GI1, the second gate insulating layer GI2, and the interlayer insulating layer ILD, the first connection line CL1, the first organic insulating layer BVIA, the second organic insulating layer TVIA, the first portion 100 and the second portion 202. The first penetration holes 10 may be formed in the first portion 100, and the second penetration holes 22 may be formed in the second portion 201.

The first penetration hole 10 may vertically penetrate the first portion 100. The first penetration hole 10 may expose an upper surface of the second organic insulating layer TVIA. Gas generated in the second organic insulating layer TVIA may be discharged in a direction perpendicular to the second organic insulating layer TVIA through the first penetration hole 10.

The second penetration hole 22 may vertically penetrate the second portion 202. The second penetration hole 22 may expose an upper surface of the second organic insulating layer TVIA and a side surface of the second organic insulating layer TVIA. Accordingly, gas generated in the second organic insulating layer TVIA may be discharged in a direction perpendicular to the second organic insulating layer TVIA. In other words, gas generated in the second organic insulating layer TVIA may not be discharged to the pixel part PXP. Accordingly, the pixels PX adjacent to the second portion 202 (e.g., pixels disposed in the area A shown in FIG. 12) may not be deteriorated, and pixel shrinkage defect may be prevented.

The display device DD according to example embodiments may include the pixel part and the first connection pattern that transmits the constant voltage to the pixel part. The first connection pattern may include a first portion and a second portion disposed between the first portion and the pixel part. A plurality of second penetration holes vertically penetrating the second portion may be formed in the second portion. The second penetration holes may expose an upper surface of the second organic insulating layer and a side surface of the second organic insulating layer. Accordingly, the gas discharged from the second organic insulating layer may be discharged in a direction perpendicular to the second organic insulating layer. In other words, the gas discharged from the second organic insulating layer may not be discharged to the pixel part. Accordingly, pixels adjacent to the first connection pattern may not be deteriorated, and pixel shrinkage defect may be prevented.

In addition, the first connection pattern may be disposed on the demultiplexing circuit part and may overlap the demultiplexing circuit part. The demultiplexing circuit part may be protected by the first connection pattern covering the demultiplexing circuit part. For example, as the first connection pattern to which the constant voltage is provided overlaps the demultiplexing circuit part, the first connection pattern may protect the demultiplexing circuit part from static electricity generated around the demultiplexing circuit part.

Although certain present disclosure embodiments and implementations have been described herein, other embodiments and modifications will be apparent from this description. Accordingly, the present disclosure is not limited to such embodiments, but rather to the broader scope of the appended claims and various obvious modifications and equivalent arrangements as would be apparent to a person of ordinary skill in the art.

What is claimed is:

1. A display device comprising:
a pixel part including a plurality of pixels and disposed in a display area;
a demultiplexing circuit part disposed in a non-display area surrounding the display area and configured to transfer a data voltage to the pixel part; and
a connection pattern disposed in the non-display area, configured to transfer a constant voltage to the pixel part, and including a first portion overlapping the demultiplexing circuit part and a second portion disposed between the first portion and the pixel part,
wherein a plurality of first penetration holes vertically penetrating the first portion is formed in the first portion,
wherein a plurality of second penetration holes vertically penetrating the second portion is formed in the second portion,
wherein the demultiplexing circuit part receives the data voltage from a data driver, and the connection pattern receives the constant voltage from a power provider, and
wherein the plurality of first penetration holes extends to an upper surface of an insulating layer which is disposed under the first portion, and the plurality of second penetration holes extends to the upper surface of the insulating layer and a side surface of the insulating layer.

2. The display device of claim 1, wherein the second portion protruded from the first portion includes the second penetration holes and protruded portions spaced apart from each other.

3. The display device of claim 2, wherein an area of each of the second penetration holes is larger than an area of each of the first penetration holes.

4. The display device of claim 2, further comprising:
a first organic insulating layer disposed under the first portion of the connection pattern; and a second organic insulating layer disposed between the connection pattern and the first organic insulating layer; and a pixel defining layer disposed on the connection pattern, wherein the insulating layer is disposed between the connection pattern and the first organic insulating layer, and wherein the pixel defining layer directly contacts the upper surface of the insulating layer and the side surface of the insulating layer through each of the second penetration holes.

5. The display device of claim 4, wherein the protruded portions cover the upper surface of the insulating layer and the side surface of the insulating layer.

6. The display device of claim 4, wherein the first organic insulating layer contacts the insulating layer.

7. The display device of claim 6, wherein each of the pixels includes a transistor substrate and an emission structure disposed on the transistor substrate,
wherein the transistor substrate includes:
a base substrate;
an active pattern disposed on the base substrate;
a first connection electrode disposed on the active pattern and being connected to the active pattern; and
a second connection electrode disposed on the first connection electrode and being connected to the first connection electrode,
wherein the emission structure includes:
a first electrode;
the pixel defining layer in which an opening extending to an upper surface of the first electrode is formed;
an emission layer disposed on the first electrode; and
a second electrode disposed on the emission layer, and
wherein the connection pattern is disposed in a same layer as the first electrode.

8. The display device of claim 7, wherein the transistor substrate further includes:
a first planarization layer disposed on the first connection electrode, including an organic material, and covering the first connection electrode; and
a second planarization layer disposed on the first planarization layer, including an organic material, and covering the second connection electrode,
wherein the first organic insulating layer is disposed on a same layer as the first planarization layer, and
wherein the insulating layer is disposed on a same layer as the second planarization layer.

9. The display device of claim 7, further comprising:
a connection line disposed under the protruded portions and overlapping the protruded portions, and
wherein the connection line includes:
a first connection line disposed on a same layer as the first connection electrode; and
a second connection line disposed on the first connection line and contacting the first connection line.

10. The display device of claim 1, wherein the second portion has a rectangular shape, and
wherein an area of each of the second penetration holes is equal to an area of each of the first penetration holes.

11. The display device of claim 10, further comprising:
a first organic insulating layer disposed under the connection pattern; and
a pixel defining layer disposed on the connection pattern, wherein the insulating layer is disposed between the connection pattern and the first organic insulating layer, and
wherein the pixel defining layer directly contacts the upper surface of the insulating layer and the side surface of the insulating layer through each of the second penetration holes.

12. The display device of claim 11, wherein the first organic insulating layer contacts the insulating layer.

13. The display device of claim 1, wherein the second portion has a rectangular shape, and
wherein an area of each of the second penetration holes is larger than an area of each of the first penetration holes.

14. The display device of claim 13, further comprising:
a first organic insulating layer disposed under the first portion of the connection pattern; and
a pixel defining layer disposed on the connection pattern, wherein the insulating layer is disposed between the connection pattern and the first organic insulating layer, and
wherein the pixel defining layer directly contacts the upper surface of the insulating layer and the side surface of the insulating layer through each of the second penetration holes.

15. The display device of claim 1, wherein the first portion has a rectangular shape.

16. The display device of claim 1, wherein the constant voltage is an initialization voltage.

17. The display device of claim 1, wherein the constant voltage is a high power voltage.

18. The display device of claim 1, wherein the constant voltage is a low power voltage.

* * * * *